United States Patent
Nakazawa

(10) Patent No.: US 9,793,111 B2
(45) Date of Patent: Oct. 17, 2017

(54) SPIN COATING METHOD AND MANUFACTURING METHOD OF ELECTRONIC COMPONENT

(71) Applicant: KABUSHIKI KAISHA TOSHIBA, Tokyo (JP)

(72) Inventor: Keisuke Nakazawa, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/066,815

(22) Filed: Mar. 10, 2016

(65) Prior Publication Data
US 2017/0076941 A1    Mar. 16, 2017

(30) Foreign Application Priority Data
Sep. 10, 2015  (JP) ................... 2015-178178

(51) Int. Cl.
H01L 21/02    (2006.01)

(52) U.S. Cl.
CPC .. H01L 21/02282 (2013.01); H01L 21/02255 (2013.01)

(58) Field of Classification Search
None
See application file for complete search history.

(56) References Cited

U.S. PATENT DOCUMENTS

| | | | |
|---|---|---|---|
| 5,505,996 A | 4/1996 | Nagayama | |
| 6,004,622 A * | 12/1999 | Yen | B05C 11/08 257/E21.266 |
| 6,194,029 B1 | 2/2001 | Aoi | |
| 8,592,939 B2 | 11/2013 | Nakazawa | |
| 8,652,571 B2 | 2/2014 | Nakazawa | |
| 2007/0092643 A1 * | 4/2007 | Yoshihara | G03F 7/162 427/240 |
| 2009/0226615 A1 | 9/2009 | Nakazawa | |
| 2012/0193596 A1 | 8/2012 | Nakazawa | |
| 2013/0032296 A1 * | 2/2013 | Zhong | C11D 1/22 156/704 |
| 2014/0072709 A1 | 3/2014 | Nakazawa | |
| 2014/0137796 A1 | 5/2014 | Nakazawa | |

FOREIGN PATENT DOCUMENTS

JP    11-31690    2/1999

* cited by examiner

*Primary Examiner* — Jay C Chang
(74) *Attorney, Agent, or Firm* — Finnegan, Henderson, Farabow, Garrett & Dunner, L.L.P.

(57) ABSTRACT

A spin coating method according to an embodiment includes forming a first material film on an underlying material. The underlying material is rotated while a solution of a second material film is supplied onto an upper surface of the first material film to make the solution stay on the upper surface of the first material film. Rotating of the underlying material is stopped or a rotational speed of the underlying material is reduced to 10 rpm or less. The underlying material is rotated after a first period elapses after the stopping of the rotating of the underlying material, or the rotational speed of the underlying material is increased after the first period elapses after the reducing of the rotational speed of the underlying material to spin off the solution from the upper surface of the first material film.

16 Claims, 5 Drawing Sheets

SPIN COATING METHOD AND MANUFACTURING METHOD OF ELECTRONIC COMPONENT

CROSS REFERENCE TO RELATED APPLICATIONS

This application is based upon and claims the benefit of priority from the prior Japanese Patent Application No. 2015-178178, filed on Sep. 10, 2015, the entire contents of which are incorporated herein by reference.

FIELD

The embodiments of the present invention relate to a spin coating method and manufacturing method of electronic component.

BACKGROUND

A thick film is formed above a substrate in an electronic component such as a semiconductor device, in some cases. For example, an insulation film having a film thickness of micrometer order is sometimes formed on a substrate by a CVD (Chemical Vapor Deposition) method. However, when an underlying surface has steps, flatness of a deposited film is lowered according to the CVD method. Film flatness can be improved by a method of forming a fine particle film above a substrate, applying a polymer solution onto the fine particle film, and hardening the fine particle film and the polymer solution by heat treatment. However, when the fine particle film is formed to be thick, the polymer solution may be hardened, while the polymer solution has not penetrated the fine particle film to the bottom of the fine particle film or has penetrated the fine particle film only locally.

DETAILED DESCRIPTION

A spin coating method according to an embodiment includes forming a first material film on an underlying material. The underlying material is rotated while a solution of a second material film is supplied onto an upper surface of the first material film to make the solution stay on the upper surface of the first material film. Rotating of the underlying material is stopped or a rotational speed of the underlying material is reduced to 10 rpm or less. The underlying material is rotated after a first period elapses after the stopping of the rotating of the underlying material, or the rotational speed of the underlying material is increased after the first period elapses after the reducing of the rotational speed of the underlying material to spin off the solution from the upper surface of the first material film.

Embodiments will now be explained with reference to the accompanying drawings. The present invention is not limited to the embodiments.

Figure 1:
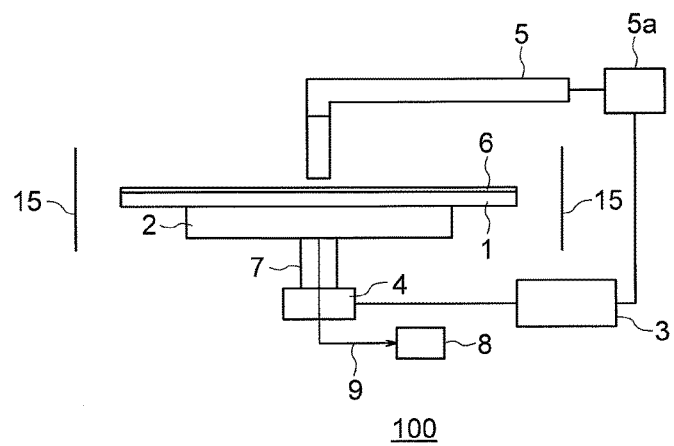
FIG. 1 shows a configuration example of a coating apparatus 100 according to an embodiment.

FIG. 1 shows a configuration example of a coating apparatus 100 according to an embodiment. The coating apparatus 100 includes a stage 2, a motor 4, a coating-liquid supplying part 5, a controller 3, and a coater cup 15.

A wafer 1 as a substrate is placed on the stage 2 that holds the wafer 1 horizontally. A vacuum source 8 is connected to the stage 2 via a vacuum line 9. The wafer 1 placed on the stage 2 is held thereon by vacuum suction of the vacuum source 8.

The motor 4 rotates and drives the stage 2 together with the wafer 1 around a rotation shaft 7 extending in a vertical direction. The motor 4 is controlled by the controller 3 to be able to change the rotational speed of the stage 2 and the wafer 1.

The coating-liquid supplying part 5 supplies a coating liquid onto an upper surface of the wafer 1 placed on the stage 2. The coating-liquid supplying part 5 is configured to be able to discharge a coating liquid from a coating-liquid supplying source 5a to a center portion of the upper surface of the wafer 1. The supply amount of the coating liquid is controlled by the controller 3.

The controller 3 controls operations of components in the coating apparatus 100, for example, the motor 4 and the coating-liquid supplying part 5.

The coater cup 15 is provided to surround the stage 2 and catches the coating liquid scattered from the surface of the wafer 1 in a substantially horizontal direction by rotation of the wafer 1.

The coating liquid may a flattening material or an embedding material. For example, the coating liquid may be a photoresist, an antireflection material, a photoresist protective material, a resist-pattern shrink material, a protective material for liquid immersion exposure, polyimide, SOG, a low-k material, or a sol-gel material.

FIGS. 2A to 3B are cross-sectional views showing an example of a spin coating method according to the present embodiment. FIGS. 2A to 3B show processes of forming an insulation film in a trench 11 formed in an underlying material 10.

Figure 2A:
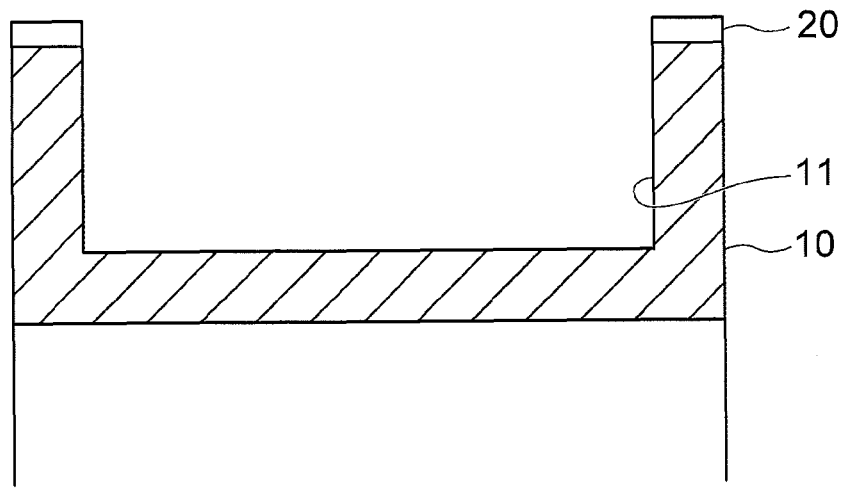
FIGS. 2A, 2B, 3A and 3B are cross-sectional views showing an example of a spin coating method according to the present embodiment.

First, the trench 11 is formed in the underlying material 10 as shown in FIG. 2A. The underlying material 10 may be the wafer 1 or a material film formed on the wafer 1, for example. The trench 11 is formed by selective etching of the underlying material 10 by using a RIE (Reactive Ion Etching) method, for example.

A stopper film 20 is formed on the underlying material 10. The stopper film 20 is an insulation film such as a silicon nitride film, and functions as a stopper in a CMP (Chemical Mechanical Polishing) process described later.

Figure 2B:
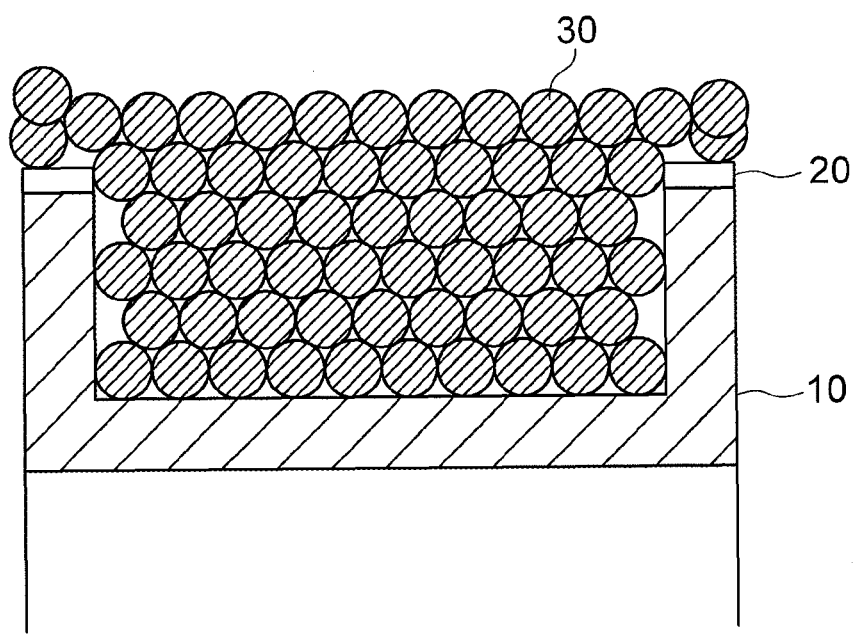

Subsequently, a first material film 30 is formed in the trench 11 and on the underlying material 10 as shown in FIG. 2B. The first material film 30 may be deposited on the underlying material 10 by a CVD (Chemical Vapor Deposition) method, for example, or may be coated onto the underlying material 10 by a coating method. The method of forming the first material film 30 is not particularly limited. The first material film 30 is formed of a fine particle material or a porous material so that a solution of a second material film described later can penetrate (soak into) the first material film 30. For example, components of the fine particle material as the first material film 30 may be a metal oxide or an organic material, such as polystyrene beads. The particle diameter in the fine particle material is from several nanometers to several micrometers. The fine particle material may be a material including particles having various diameters. The shape of the fine particle material may be spherical, polyhedral, or amorphous. Further, the porous material as the first material film 30 is formed of a material including gaps that allow the solution of the second material film to flow into the porous material. The shape of pores in the porous material may be circular (spherical), polygonal (polyhedral), or amorphous.

Figure 3A:
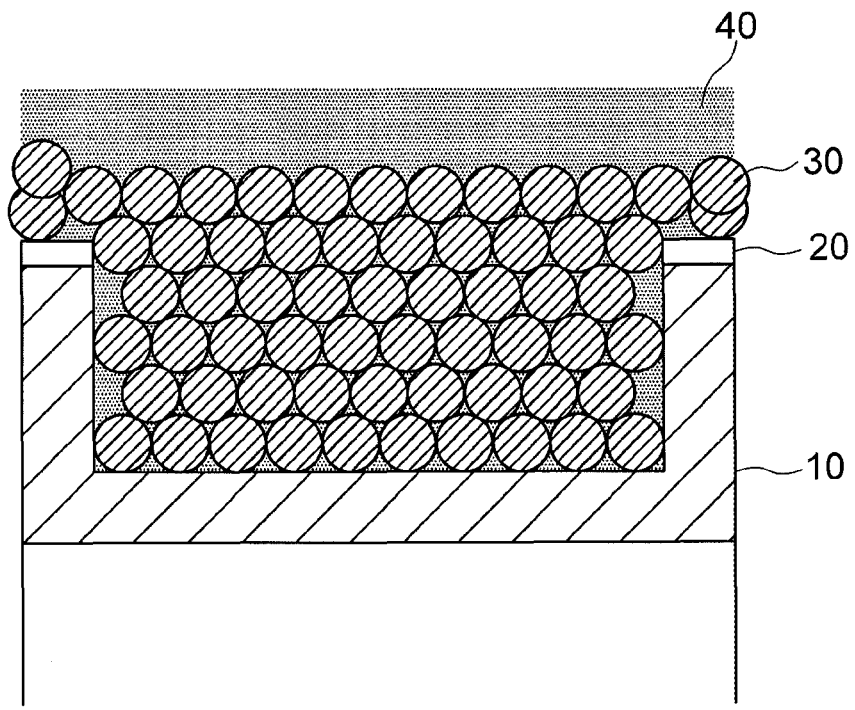

Next, the underlying material 10 is rotated, and a solution of a second material film 40 is supplied onto the upper surface of the first material film, as shown in FIG. 3A. The solution of the second material film 40 is a solution including a polymer material and may be an SOG (Spin On Glass) coating liquid, for example. The polymer material of the second material film 40 may be an inorganic material or an organic material. The solution of the second material film 40 may be a solution in which a polymer material is dissolved in a volatile solvent. The solvent is, for example, propylene glycol monomethylether, propylene glycol monomethylether acetate, or the like. Because the above-described solution of the second material film 40 has a relatively low viscosity and its solvent can be easily evaporated, it can be easily dried by rotation of the underlying material 10. That is, the solution of the second material film 40 flows down from an end portion of the first material film 30 before sufficiently penetrating the first material film 30, so that the solution of the second material film 40 is dried.

A coating method of the solution of the second material film 40 is described next.

Figure 4A:
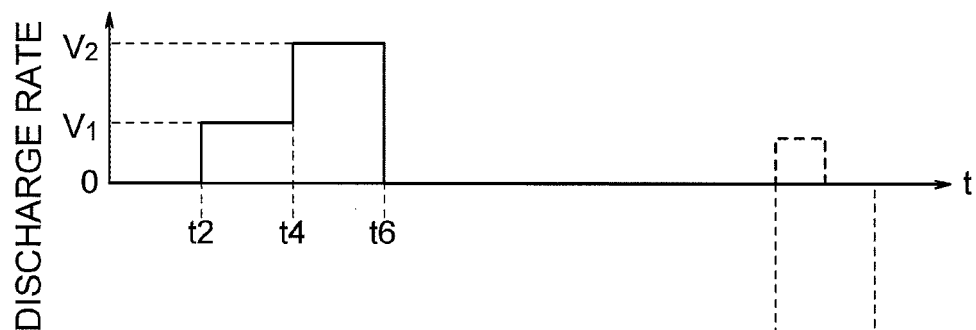
FIGS. 4A and 4B are graphs showing the coating method of the solution of the second material film 40 according to the present embodiment.
Figure 4B:
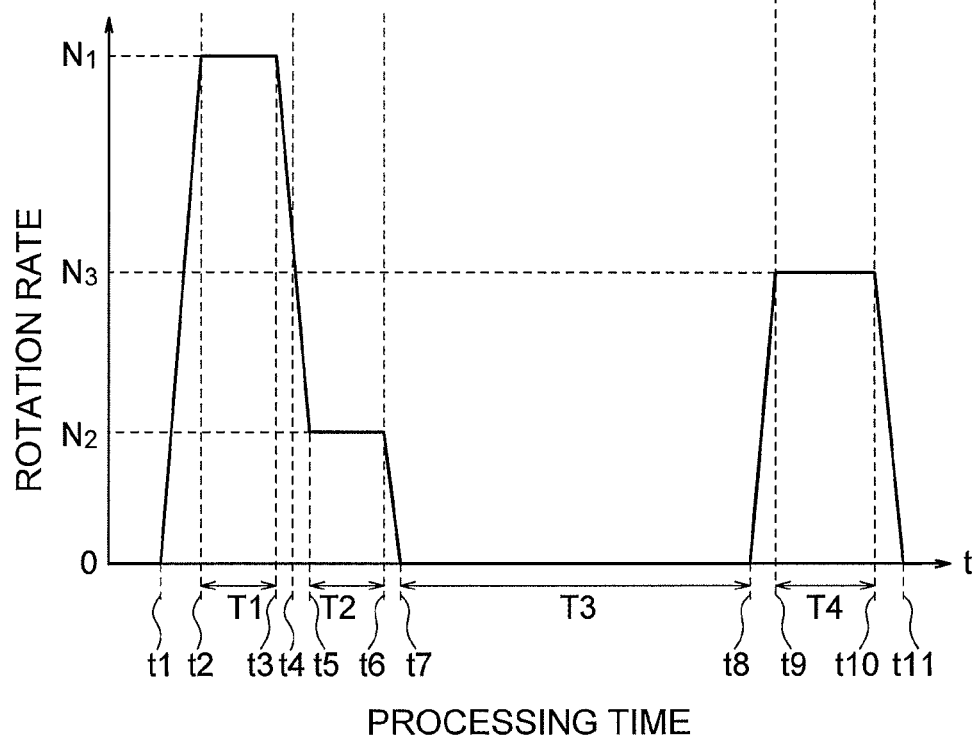

FIGS. 4A and 4B are graphs showing the coating method of the solution of the second material film 40 according to the present embodiment. FIG. 4A shows a discharge rate of the solution of the second material film 40 from the coating-liquid supplying part 5. The discharge rate is the amount of discharge per unit time. FIG. 4B shows a rotational speed of the stage 2 (the underlying material 10). The rotational speed is the number of revolutions per unit time. The horizontal axes of the graphs represent a time.

As shown in FIGS. 4A and 4B, the stage 2 is started to be rotated at t1, so that the underlying material 10 and the first material film 30 are rotated. In a period T1 from t2 to t3 (for about 1 to 2 seconds, for example), while the underlying material 10 and the first material film 30 are rotated at a first rotational speed N1, the solution of the second material film 40 is supplied onto the upper surface of the first material film 30 at a discharge rate V1 (first spinning). Accordingly, the entire upper surface of the first material film 30 is made wet with the solution of the second material film 40. The first rotational speed N1 in the first spinning is about 1000 rpm to 3000 rpm, for example. When the rotational speed of the underlying material 10 exceeds about 3000 rpm, the solution of the second material film 40 on the first material film 30 may be pushed back to the center portion of the underlying material 10 by a gas flow between the stage 2 or the underlying material 10 and the coater cup 15, depending on the viscosity of the solution of the second material film 40. In this case, the solution of the second material film 40 cannot spread to an end portion of the upper surface of the first material film 30 and therefore the entire upper surface of the first material film 30 cannot be made wet with the solution of the second material film 40. Accordingly, the first rotational speed N1 is preferably about 3000 rpm or less, for example. On the other hand, when the first rotational speed N1 is too slow, the solution of the second material film 40 may flow locally. Also in this case, the solution of the second material film 40 cannot spread over the entire upper surface of the first material film 30. Accordingly, the first rotational speed N1 is preferably from about 1000 rpm to 3000 rpm, for example.

Although the solution of the second material film 40 is discharged in a period from t2 to t4 in the first spinning, the discharge period may be applied to the period T1. That is, the discharge of the solution of the second material film 40 may be stopped at t3. Further, the discharge of the solution of the second material film 40 may be stopped before t3, so long as the entire upper surface of the first material film 30 can be made wet with the solution of the second material film 40. In this case, the discharge amount of the solution of the second material film 40 can be saved.

Subsequently, while the underlying material 10 and the first material film 30 are rotated at a second rotational speed N2 in a period T2 from t5 to t6 (for about 4 to 5 seconds, for example), the solution of the second material film 40 is supplied onto the upper surface of the first material film 30 at a discharge rate V2 (second spinning). The second rotational speed N2 is slower than the first rotational speed N1, so that the solution of the second material film 40 can stay on the entire upper surface of the first material film 30. Staying of a solution means that the solution is retained on a surface by a surface tension or the like so that the solution does not flow down from an end portion of the surface. The second rotational speed N2 is from about 100 rpm to 300 rpm, for example. When the rotational speed of the underlying material 10 is from about 100 rpm to 300 rpm, the solution of the second material film 40 does not flow down from the upper surface of the first material film 30 but can stay on the upper surface of the first material film 30, depending on the viscosity of the solution of the second material film 40. Further, because the entire upper surface of the first material film 30 is already made wet with the solution of the second material film 40 in the first spinning in the period T1, it is relatively easy to make the solution of the second material film 40 stay on the entire upper surface of the first material film 30 in the second spinning. Note that the discharge rate V2 is preferably higher than the discharge rate V1 in order to shorten the period T2 (that is a time period of the second spinning). However, the discharge rate V2 can be equal to or lower than the discharge rate V1, so long as the solution of the second material film 40 can stay on the entire upper surface of the first material film 30.

Although the solution of the second material film 40 is discharged in a period from t4 to t6 in the second spinning, the discharge period may be applied to the period T2. That is, the discharge of the solution of the second material film 40 may be started at t5 and be stopped at t6. Further, the discharge of the solution of the second material film 40 may be stopped before t6, so long as the solution of the second material film 40 is made to stay on the upper surface of the first material film 30. In this case, the discharge amount of the solution of the second material film 40 can be saved.

Subsequently, the rotation of the underlying material 10 and the first material film 30 is stopped in a period T3 from t7 to t8, and the solution of the second material film 40 is kept on the upper surface of the first material film 30. The period T3 is from several tens of seconds to about one minute, for example. In the period T3, the solution of the second material film 40 is allowed to penetrate the first material film 30, and the solvent of the solution of the second material film 40 is evaporated to increase the viscosity of the solution. The period T3 is set in such a manner that the solution of the second material film 40 can penetrate the entire inside of the first material film 30 and the viscosity of the solution of the second material film 40 becomes a predetermined viscosity. The underlying material 10 may be heated, or air may be blown to the solution of the second material film 40, in order to promote the evaporation of the solvent. In this case, the stage 2 includes a heater (not shown) or a blower (not shown) is provided near the stage 2. Alternatively, the underlying material 10 and the first material film 30 may be rotated at a very low rate, for example, 10 rpm or lower, instead of completely stopping the rotation of the underlying material 10 and the first material film 30.

After the rotation of the stage 2 and the underlying material 10 is stopped or the rotational speed is changed to be very low, and thereafter the period T3 (a first period) elapses, the stage 2 and the underlying material 10 are rotated again or the rotational speed thereof is increased in a period T4 from t9 to t10, so that the solution of the second material film 40 is spun off from the upper surface of the first material film 30 by a centrifugal force (third spinning). With this operation, the stage 2 and the underlying material 10 are rotated at a third rotational speed N3. The third rotational speed N3 is higher than at least the second rotational speed N2 in order to spin off the solution of the second material film 40, of which the viscosity has been increased in the period T3, from the upper surface of the first material film 30 by the centrifugal force. The third rotational speed N3 is about 300 rpm or higher, for example. The third spinning spins off the solution of the second material film 40 from the upper surface of the first material film 30, so that the film thickness of the second material film 40 can be adjusted. Also, the flatness of an upper surface of the second material film 40 can be improved at the same time.

Although the third rotational speed N3 is higher than the second rotational speed N2, the third rotational speed N3 may be lower or higher than the first rotational speed N1. Because the viscosity of the solution of the second material film 40 has been increased, the solution of the second material film 40 is not spun off as in the first spinning but stays on the first material film 30 to some extent, even when the third rotational speed N3 is higher than the first rotational speed N1. Therefore, the adjustment of the film thickness of the second material film 40 can be achieved.

By stopping the rotation of the stage 2 at t11, the second material film 40 is formed to have a predetermined film thickness and the upper surface thereof becomes flat, as shown in FIG. 3A.

Figure 3B:
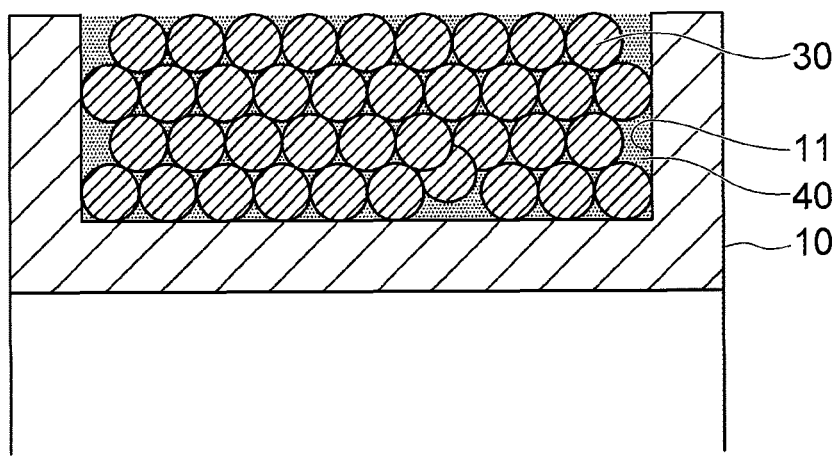

After the solution of the second material film 40 is spin-coated, upper portions of the second material film 40 and the first material film 30 are polished away by the CMP method, as shown in FIG. 3B. This polishing is performed by using the stopper film 20 as a stopper. With this operation, an insulation film including the first material film 30 and the second material film 40 is formed in the trench 11. Because the second material film 40 has penetrated the first material film 30 to the bottom portion, the formed insulation film has excellent quality.

In the third spinning in the period T4, a cleaning liquid (for example, thinner) that dissolves the solution of the second material film 40 may be supplied to an end portion and a back surface of the underlying material 10. This can remove the second material film 40 at the end portion of the underlying material 10 (edge cut). Further, the second material film 40 adhering to the back surface of the underlying material 10 can be also removed (back rinse).

Further, the solution of the second material film 40 may be discharged again at an initial stage of the third spinning in the period T4, as shown in FIG. 4A with a broken line. That is, the third spinning may be performed in such a manner that the solution of the second material film 40 is supplied to the upper surface of the first material film 30, supply of the solution is then stopped and rotation is continued for a certain period, and thereafter the solution of the second material film 40 is spun off from the upper surface of the first material film 30. In this manner, the film thickness of the second material film 40 may be adjusted, or the flatness of the second material film 40 may be further improved. Furthermore, additional discharge of the solution in the period T4 may be performed at a different rotational speed from N3.

As described above, the spin coating method according to the present embodiment makes the solution of the second material film 40 stay on the upper surface of the first material film 30, and then stops rotation of the underlying material 10 temporarily. Therefore, even when the first material film 30 is relatively thick, the solution of the second material film 40 can sufficiently penetrate the first material film 30 to the bottom portion. Consequently, the material films 30 and 40 that are relatively thick can be formed in the trench 11 or on an upper surface of the underlying material 10.

The solution of the second material film 40 used for SOG or the like has a relatively low viscosity and the solvent thereof can be easily evaporated. Therefore, the solution of the second material film 40 can be easily dried by rotation of the underlying material 10. For this reason, in a case of spin coating the solution of the second material film 40 on the first material film 30 by performing spinning once or a plurality of times without the period T3 during which the solution of the second material film 40 is made to stay, the solution of the second material film 40 flows down from the end portion of the first material film 30 and is dried, before sufficiently penetrating the first material film 30. Thus, it is difficult to form a thick material film having excellent quality by using the first material film 30 and the second material film 40.

On the other hand, the period T3 during which the solution of the second material film 40 is made to stay on the upper surface of the first material film 30 is provided according to the present embodiment. Therefore, the solution of the second material film 40 can sufficiently penetrate the first material film 30 to the bottom portion. Consequently, a thick material film having excellent quality can be formed by using the first material film 30 and the second material film 40.

Further, it is possible to adjust the viscosity of the solution of the second material film 40 in the period T3 during which rotation of the underlying material 10 is stopped with the solution of the second material film 40 staying on the upper surface of the first material film 30. Accordingly, because the viscosity of the solution of the second material film 40 has become high, when the underlying material 10 is rotated again to spin off the solution of the second material film 40 after the predetermined period T3 has elapsed, the film thickness of the second material film 40 can be easily adjusted. It is also possible to easily flatten the second material film 40.

Furthermore, in the period of allowing the solution of the second material film 40 to penetrate the first material film 30, the solution of the second material film 40 stays on the upper surface of the first material film 30 and supply of the solution of the second material film 40 is stopped. Therefore, the solution of the second material film 40 is saved.

(Modification)

Figure 5:
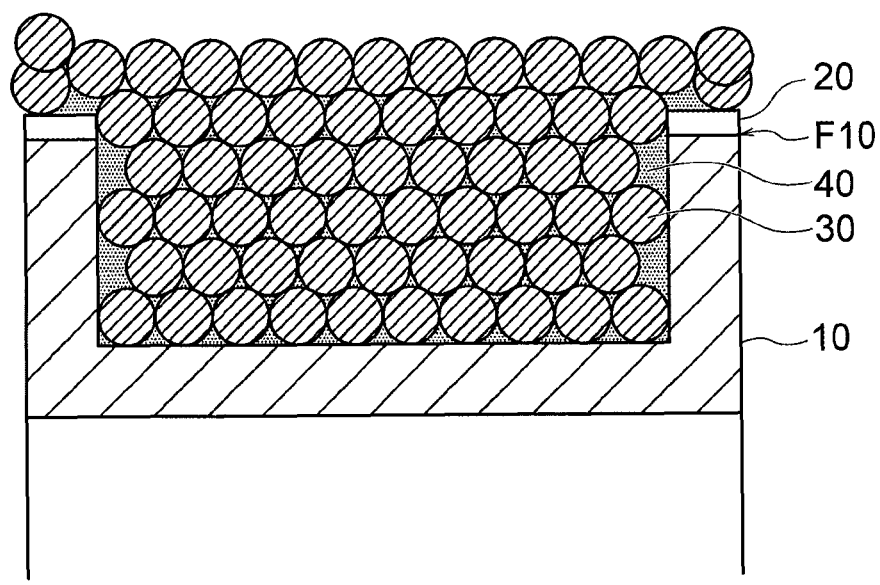
FIG. 5 is a cross-sectional view showing an example of a spin coating method according to a modification of the present embodiment.

FIG. 5 is a cross-sectional view showing an example of a spin coating method according to a modification of the present embodiment. After the processes shown in FIGS. 2A and 2B are performed, the underlying material 10 is rotated and the solution of the second material film 40 is supplied onto the upper surface of the first material film, as shown in FIGS. 4A and 4B. Subsequently, in the period T3, the rotation of the underlying material 10 is stopped while the solution of the second material film 40 is made to stay on the upper surface of the first material film 30. Further, the underlying material 10 is rotated again in the period T4.

According to the above embodiment, the upper surface of the second material film 40 is at a higher level than the upper surface of the first material film 30 after the process of the period T4 is performed. On the other hand, according to the present modification, the upper surface of the second material film 40 is at a level that is higher than an upper surface F10 of the underlying material 10 and is lower than the upper surface of the first material film 30, as shown in FIG. 5. The height (film thickness) of the second material film 40 can be changed by adjusting the standby time period T3 or the rotational speed N3 in FIGS. 4A and 4B. That is, when the standby time period T3 is shortened or the rotational speed N3 is increased, the height (the film thickness) can be reduced. Because the upper surface of the second material film 40 is at a lower level than the upper surface of the first material film 30 as described above, the possibility of occurrence of cracks after formation of the second material film 40 can be reduced. There is no problem even when the upper surface of the second material film 40 is at a lower level than the upper surface of the first material film 30, because the upper portions of the first material film 30 and the second material film 40 are polished away to the stopper film 20 by the CMP method, as described with reference to FIG. 3B.

Other configurations and processes of the present modification are identical to those of the above embodiment. Accordingly, the present modification can achieve effects identical to those of the above embodiment.

The above embodiment can be used for filling a peripheral region of a three-dimensional semiconductor memory or the like with an insulation material.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A spin coating method comprising:
    forming a first material film on an underlying material;
    rotating the underlying material while a solution of a second material film is supplied onto an upper surface of the first material film, to make the solution stay on the upper surface of the first material film;
    stopping the rotating of the underlying material or reducing a rotational speed of the underlying material to 10 rpm or less; and
    spinning off the solution from the upper surface of the first material film by rotating the underlying material after a first period elapses after the stopping of the rotating of the underlying material, or by increasing the rotational speed of the underlying material after the first period elapses after the reducing of the rotational speed of the underlying material,
    wherein when the solution is spun off, the solution is supplied onto the upper surface of the first material film, the supplying of the solution is stopped and rotation is then performed for a certain period of time, and thereafter the solution is spun off.

2. The method of claim 1, wherein
    before the solution is made to stay, the solution is supplied onto the upper surface of the first material film while the underlying material is rotated at a first rotational speed, to make an entire upper surface of the first material film wet with the solution, and
    when the solution is made to stay, the underlying material is rotated at a second rotational speed slower than the first rotational speed while the solution is supplied onto the upper surface of the first material film, to make the solution stay on the entire upper surface of the first material film.

3. The method of claim 2, wherein the underlying material is rotated at a third rotational speed that is faster than the second rotational speed, when the solution is spun off.

4. The method of claim 2, wherein a cleaning liquid for dissolving the solution is supplied to an end portion and a back surface of the underlying material, when the solution is spun off.

5. The method of claim 2, wherein the first material film is formed of a fine particle material or a porous material that allows penetration of the solution thereinto.

6. The method of claim 1, further comprising heating after the solution on the upper surface of the first material film is spun off, to harden the solution that has penetrated an inside of the first material film.

7. The method of claim 1, wherein a cleaning liquid for dissolving the solution is supplied to an end portion and a back surface of the underlying material, when the solution is spun off.

8. The method of claim 1, wherein the first material film is formed of a fine particle material or a porous material that allows penetration of the solution thereinto.

9. A manufacturing method of an electronic component, comprising:
    forming a first material film on an underlying material;
    rotating the underlying material while a solution of a second material film is supplied onto an upper surface of the first material film, to make the solution stay on the upper surface of the first material film;
    stopping the rotating of the underlying material or reducing a rotational speed of the underlying material to 10 rpm or less; and
    spinning off the solution on the upper surface of the first material film by rotating the underlying material or increasing the rotational speed of the underlying material after a first period elapses after the stopping of the rotating of the underlying material, or after the first period elapses after the reducing of the rotational speed of the underlying material,
    wherein when the solution is spun off, the solution is supplied onto the upper surface of the first material film, the supplying of the solution is stopped and rotation is then performed for a certain period of time, and thereafter the solution is spun off.

10. The method of claim 9, wherein
    before the solution is made to stay, the solution is supplied onto the upper surface of the first material film while the underlying material is rotated at a first rotational speed, to make an entire upper surface of the first material film wet with the solution, and when the solution is made to stay, the underlying material is rotated at a second rotational speed slower than the first rotational speed while the solution is supplied onto the upper surface of the first material film, to make the solution stay on the entire upper surface of the first material film.

11. The method of claim 10, wherein the underlying material is rotated at a third rotational speed that is faster than the second rotational speed, when the solution is spun off.

12. The method of claim 10, wherein the underlying material is rotated at the second rotational speed that is slower than the first rotational speed, when the solution is spun off.

13. The method of claim 10, wherein a cleaning liquid for dissolving the solution is supplied to an end portion and a back surface of the underlying material, when the solution is spun off.

14. The method of claim 10, wherein the first material film is formed of a fine particle material or a porous material that allows penetration of the solution thereinto.

15. The method of claim 9, wherein a cleaning liquid for dissolving the solution is supplied to an end portion and a back surface of the underlying material, when the solution is spun off.

16. The method of claim 9, wherein the first material film is formed of a fine particle material or a porous material that allows penetration of the solution thereinto.

\* \* \* \* \*